(12) United States Patent
Burns et al.

(10) Patent No.: US 10,529,569 B2
(45) Date of Patent: Jan. 7, 2020

(54) SELF ALIGNED PATTERN FORMATION POST SPACER ETCHBACK IN TIGHT PITCH CONFIGURATIONS

(71) Applicant: INTERNATIONAL BUSINESS MACHINES CORPORATION, Armonk, NY (US)

(72) Inventors: Sean D. Burns, Hopewell Junction, NY (US); Lawrence A. Clevenger, Rhinebeck, NY (US); Matthew E. Colburn, Schenectady, NY (US); Nelson M. Felix, Briarcliff Manor, NY (US); Sivananda K. Kanakasabapathy, Niskayuna, NY (US); Christopher J. Penny, Saratoga Springs, NY (US); Roger A. Quon, Rhinebeck, NY (US); Nicole A. Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/058,232

(22) Filed: Aug. 8, 2018

(65) Prior Publication Data
US 2018/0350599 A1 Dec. 6, 2018

Related U.S. Application Data

(63) Continuation of application No. 15/786,090, filed on Oct. 17, 2017, now Pat. No. 10,121,661, which is a
(Continued)

(51) Int. Cl.
*H01L 23/52* (2006.01)
*H01L 21/033* (2006.01)
(Continued)

(52) U.S. Cl.
CPC .... *H01L 21/0337* (2013.01); *H01L 21/31144* (2013.01); *H01L 21/32139* (2013.01);
(Continued)

(58) Field of Classification Search
CPC .......... H01L 21/0337; H01L 21/32139; H01L 23/528; H01L 21/31144; H01L 21/76816;
(Continued)

(56) References Cited

U.S. PATENT DOCUMENTS 7,488,644 B2 * 2/2009 Lee .................. H01L 27/10855
438/253
7,709,335 B2 * 5/2010 Kim ..................... H01L 27/105
438/257
(Continued)

OTHER PUBLICATIONS

List of IBM Patents or Patent Applications Treated as Related dated Aug. 8, 2018, 2 pages.

*Primary Examiner* — Vu A Vu
(74) *Attorney, Agent, or Firm* — Tutunjian & Bitetto, P.C.; Vazken Alexanian

(57) ABSTRACT

A method of forming a structure for etch masking that includes forming first dielectric spacers on sidewalls of a plurality of mandrel structures and forming non-mandrel structures in space between adjacent first dielectric spacers. Second dielectric spacers are formed on sidewalls of an etch mask having a window that exposes a connecting portion of a centralized first dielectric spacer. The connecting portion of the centralized first dielectric spacer is removed. The mandrel structures and non-mandrel structures are removed selectively to the first dielectric spacers to provide an etch mask. The connecting portion removed from the centralized first dielectric spacer provides an opening connecting a first trench corresponding to the mandrel structures and a second trench corresponding to the non-mandrel structures.

11 Claims, 12 Drawing Sheets

Related U.S. Application Data continuation of application No. 15/403,371, filed on Jan. 11, 2017, now Pat. No. 9,934,970.

(51) Int. Cl.

| | |
|---|---|
| *H01L 21/311* | (2006.01) |
| *H01L 21/768* | (2006.01) |
| *H01L 23/528* | (2006.01) |
| *H01L 21/3213* | (2006.01) |
| *H01L 21/31* | (2006.01) |
| *H01L 21/027* | (2006.01) |
| *H01L 45/00* | (2006.01) |
| *H01L 21/28* | (2006.01) |
| *H01L 51/00* | (2006.01) |

(52) U.S. Cl.
CPC ...... *H01L 21/76816* (2013.01); *H01L 23/528* (2013.01); *H01L 21/0274* (2013.01); *H01L 21/28123* (2013.01); *H01L 21/31* (2013.01); *H01L 21/76897* (2013.01); *H01L 45/1675* (2013.01); *H01L 51/0018* (2013.01); *H01L 2224/0362* (2013.01); *H01L 2224/11622* (2013.01)

(58) Field of Classification Search
CPC ... H01L 2224/11622; H01L 2224/0362; H01L 21/28123; H01L 21/76897; H01L 21/31; H01L 21/0274; H01L 51/0018; H01L 45/1675

USPC .......................................................... 257/773

See application file for complete search history.

(56) References Cited

U.S. PATENT DOCUMENTS

| | | | |
|---|---|---|---|
| 8,835,321 B2 * | 9/2014 | Ha | H01L 21/0337 438/696 |
| 8,921,225 B2 | 12/2014 | Yuan et al. | |
| 8,927,425 B1 * | 1/2015 | Lam | H01L 21/76802 438/270 |
| 8,954,913 B1 | 2/2015 | Yuan et al. | |
| 9,147,653 B2 | 9/2015 | Yuan et al. | |
| 9,324,722 B1 | 4/2016 | Woo et al. | |
| 9,934,970 B1 * | 4/2018 | Burns | H01L 21/0337 |
| 10,121,661 B2 * | 11/2018 | Burns | H01L 21/0337 |
| 2015/0028489 A1 | 1/2015 | Yuan et al. | |
| 2015/0046888 A1 | 2/2015 | Lafferty et al. | |
| 2015/0097263 A1 * | 4/2015 | Kim | H01L 21/743 257/506 |
| 2015/0113484 A1 | 4/2015 | Yuan et al. | |
| 2015/0286764 A1 | 10/2015 | Yuan et al. | |
| 2016/0163584 A1 * | 6/2016 | Yuan | H01L 21/31144 438/618 |
| 2017/0092506 A1 * | 3/2017 | deVilliers | H01L 21/0337 |

* cited by examiner

SELF ALIGNED PATTERN FORMATION POST SPACER ETCHBACK IN TIGHT PITCH CONFIGURATIONS

BACKGROUND

Technical Field

The present invention generally relates to electrical devices of micro scale and less, and more particularly to patterning features of semiconductor devices using multiple masking structures.

Description of the Related Art

Multiple patterning (or multi-patterning) is a class of technologies for manufacturing integrated circuits (ICs), developed for photolithography to enhance the feature density. The premise is that a single lithographic exposure may not be enough to provide sufficient resolution. Self-aligned double patterning (SADP) is one method for employing multiple patterning process flows. In back end of line (BEOL) self-aligned double patterning (SADP), the spacer is used to directly pattern inter-metal dielectric instead of metal features. In traditional SADP process flows, it is not possible to connect a mandrel formed trench to a non-mandrel formed trench.

SUMMARY

In accordance with one embodiment, an etch method is disclosed that includes forming a plurality of mandrel structures on a substrate; and forming first dielectric spacers on sidewalls of said plurality of mandrel structures. A fill of non-mandrel structures is formed in the space between adjacent first dielectric spacers. Second dielectric spacers are formed on sidewalls of an etch mask having a window that exposes a connecting portion of a centralized first dielectric spacer in the etch window. The second dielectric spacer covers the first dielectric spacers that do not include the connecting portion. The connecting portion of the centralized first dielectric spacer is removed. The method continues with etching the electrically conductive material layer using the first dielectric spacers and a remaining portion of the centralized first dielectric material as an etch mask, wherein a trench is formed connecting a first trench corresponding the mandrel structure and a second trench corresponding to the non-mandrel structure.

In another embodiment, a method of forming a structure for etch masking is described that includes forming first dielectric spacers on sidewalls of a plurality of mandrel structures; and forming a fill of non-mandrel structures in space between adjacent first dielectric spacers. The method may further include forming second dielectric spacers on sidewalls of an etch mask having a window that exposes a connecting portion of a centralized first dielectric spacer in the etch window. In a following step, the method can continue with removing a connecting portion of the centralized first dielectric spacer, and removing the mandrel structures and non-mandrel structures. The remaining portions of the first dielectric spacers can provide an etch mask, and the connecting portion removed from the centralized first dielectric spacer can provide an opening connecting a first trench corresponding to the mandrel structures and a second trench corresponding to the non-mandrel structures.

In yet another aspect, an etched structure that is provided by a self-aligned double patterning (SADP) etch process is described herein, that can include a plurality of etched features separated by trenches corresponding to mandrel and non-mandrel structures of the SADP etch process. The etched structure can further include an opening in at least one of said plurality of etched features connecting a first trench of the trenches separating etched features corresponding to one of the mandrel structures and a second trench corresponding to one of the non-mandrel structures.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
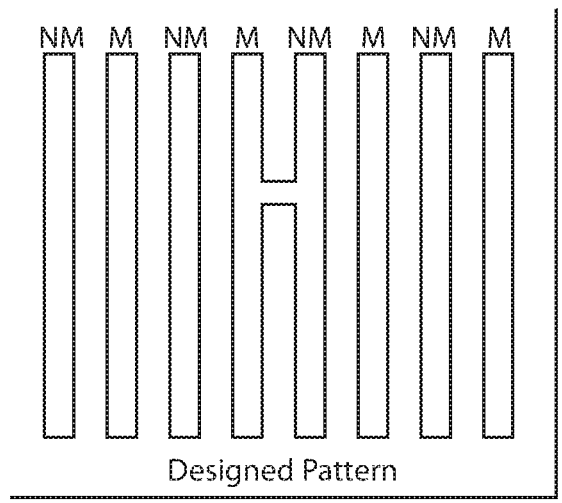
FIG. 1 is a top down view depicting one embodiment of a design pattern to be provided by the self-aligned double patterning (SADP) process, in accordance with an embodiment of the present invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In current self-aligned double patterning (SADP) process flows, it is not possible to connect a mandrel formed trench to a non-mandrel formed trench. For example, in advanced interconnects with critical dimensions less than 5 nm to 20 nm, current process tolerances do not provide a method to connect a mandrel formed wire to a non-mandrel formed wire. The methods and structures disclosed herein provides two core concepts for advancing SADP process flows. In some embodiments, by introducing an additional lithography step and exposing a part of the spacer between a mandrel line and a non-mandrel line, it is possible to etch away at least a portion of that spacer and connect the mandrel to the non-mandrel formed wire. In some embodiments, the methods and structures described herein provide a spacer having an increased height to preferentially protect neighboring spacers in the above described exposure step. In other embodiments, the methods and structures described herein may further include employing a second spacer material that is more etch resistant than the aforementioned spacer that is treated with the exposure step as part of the process sequence to connect the mandrel and non-mandrel formed features. Some embodiments of the methods and structures of the present disclosure are now described with reference to FIGS. 1-14B.

FIG. 1 depicts one embodiment of a design pattern to be provided by the self-aligned double patterning (SADP) process that is described herein, in which a mandrel formed wire and a non-mandrel formed wire are connected. The wires formed using a mandrel structures of the SADP process are identified by reference letter "M", and the wires formed using the non-mandrel structures of the SADP process are identified by reference letter "NM". The wires illustrated in FIG. 1 may provide for electrical communication in an electrical device structure.

Figure 2:
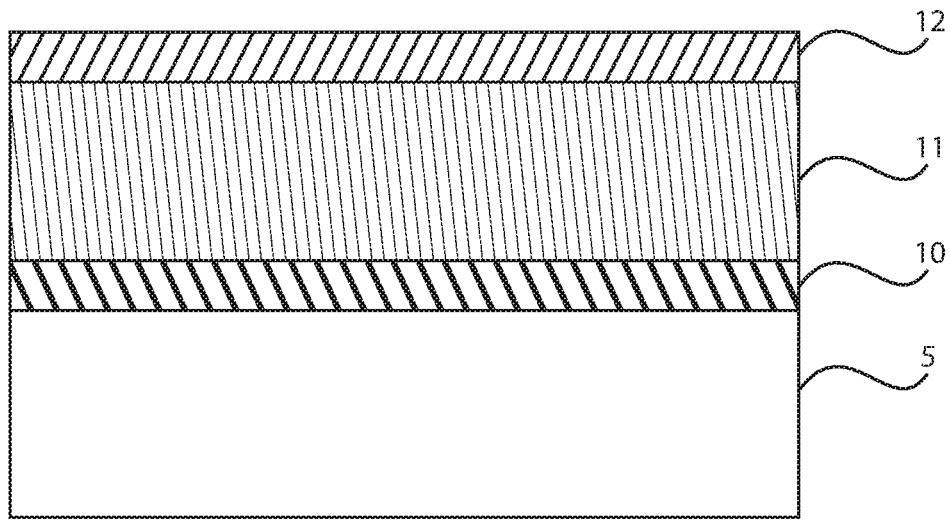
FIG. 2 is a side cross-sectional view depicting a material stack including a first hardmask layer atop an interlevel dielectric layer, wherein an organic planarization layer and a second hardmask layer are overlying the first hardmask layer, in accordance with one embodiment of the present disclosure.

FIG. 2 depicts a material stack including a first hardmask layer 10 atop an interlevel dielectric layer 5. Although not depicted in the supplied figures the interlevel dielectric layer 5 is present over a substrate, e.g., semiconductor substrate, that may include a plurality of electrical devices. The electrical devices may include semiconductor devices and transistors, such as field effect transistors (FETs), metal oxide semiconductor field effect transistor (MOSFET), fin type field effect transistors (FinFETs), vertical field effect transistors (VFET), bipolar junction transistor (BJT), heterojunction bipolar junction transistor (BJT) and semiconductor devices including nanostructures and combinations thereof; memory devices, such as dynamic random access memory (DRAM), embedded dynamic random access memory (eDRAM), flash memory, phase change memory devices and combinations thereof; and passive electrical devices such as resistors, capacitors and diodes.

The interlevel dielectric layer 5 may include vias containing electrically conducive material that is in communication with the electrical devices in the underlying substrate. The interlevel dielectric layer 5 is typically composed of a dielectric material, such as an oxide, e.g., silicon oxide, a nitride, e.g., silicon nitride, or an oxynitride, e.g., silicon oxynitride. In some other examples, the interlevel dielectric layer 5 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 5 may be formed using a deposition process, such as chemical vapor deposition (CVD) or spin on deposition.

The first hardmask layer 10 may be composed of any material suitable for use as a hardmask. The first hardmask layer 10 may be selected to provide suitable selectivity to the interlevel dielectric layer 5 and other materials present in the structure. In one example, the first hardmask layer 10 may be composed of titanium nitride (TiN), silicon nitride (SiN), silicon oxide or other suitable material. The first hardmask layer 10 may be formed using physical vapor deposition (PVD), chemical vapor deposition (CVD), plasma enhanced chemical vapor deposition (PECVD) or other suitable technique.

Still referring to FIG. 2, in some embodiments, the material stack may include an organic planarization layer (OPL) 11 and a second hardmask layer 12. The organic planarization layer (OPL) layer 11 may be composed of an organic polymer that may include polyacrylate resin, epoxy resin, phenol resin, polyimide resin, polyimide resin, unsaturated polyester resin, polyphenylenether resin, polyphenylenesulfide resin, or benzocyclobutene (BCB). The OPL layer 11 is present atop the first hardmask layer 10. The second hardmask layer 12 may be similar to the first metal containing layer 10. Therefore, the above description of the first hardmask layer 10 is suitable for describing the second hardmask layer 12. For example, the second hardmask layer 12 may be titanium nitride (TiN). In some embodiments, the OPL layer 11 and the second hardmask layer 12 may be omitted. The OPL layer 11 and second hardmask layer have been omitted from some figures for the sake of clarity.

Figure 3:
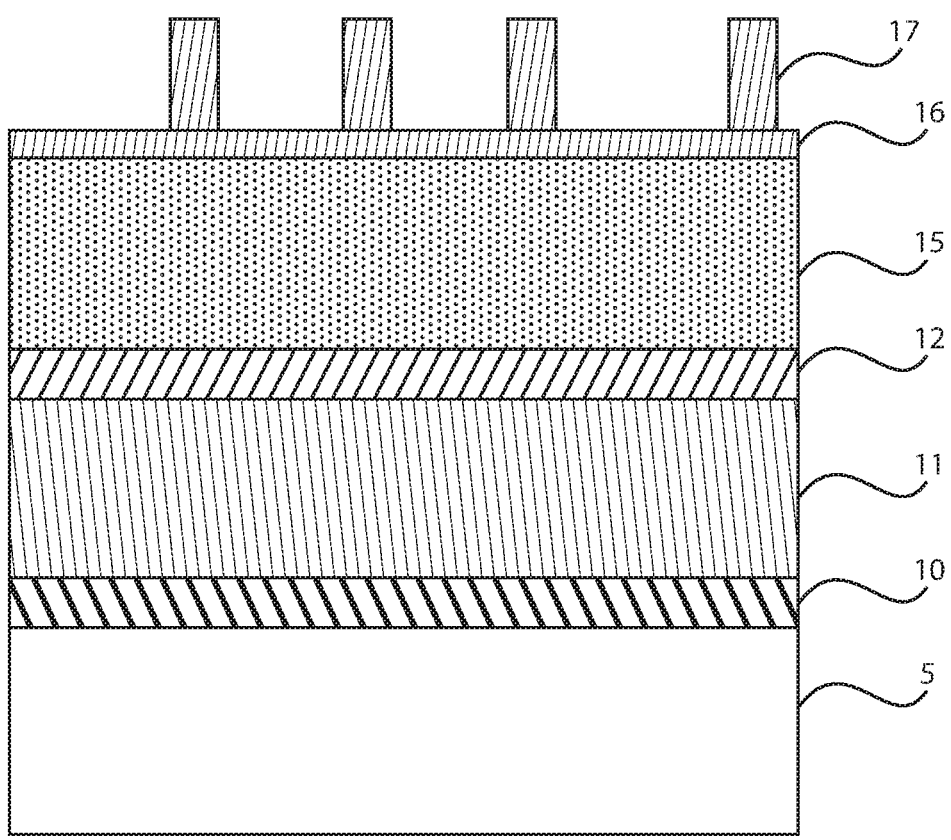
FIG. 3 is a side cross-sectional view depicting one embodiment of forming an amorphous silicon layer atop the structure depicted in FIG. 2, and forming a photoresist mask atop the amorphous silicon layer.

FIG. 3 depicts one embodiment of forming a mandrel layer 15 atop the structure depicted in FIG. 2, and forming a photoresist mask 17 over the mandrel layer 15. The mandrel layer 15 is provided for forming the mandrels of the SADP process. In one example, the mandrel layer 15 is composed of amorphous silicon (Si) that is deposited using a chemical vapor deposition (CVD) process, such as plasma enhanced chemical vapor deposition (PECVD). It is noted that this is only one example of a material layer that is suitable for the mandrel layer 15. Other materials may also be suitable for the mandrel layer 15 including titanium oxide (TiO). The mandrel layer 15 may also be deposited using other CVD process, such as atmospheric pressure CVD (APCVD), low pressure CVD (LPCVD), plasma enhanced CVD (EPCVD), metal-organic CVD (MOCVD) and combinations thereof.

FIG. 3 also depicts forming a photoresist mask 17 over the mandrel layer 15 for patterning the mandrels. In some embodiments, a hard mask dielectric layer 16 is present between the mandrel containing layer 15 and the photoresist mask 17. The material layer for the hard mask dielectric layer 16 may be an oxide, such as silicon oxide, which can be blanket deposited using chemical vapor deposition, e.g., plasma enhanced chemical vapor deposition (PECVD). In other embodiments, the hard mask dielectric layer 16 may be formed using thermal growth.

A photoresist mask 17 can be produced by applying a photoresist layer, exposing the photoresist layer to a pattern of radiation, and then developing the pattern into the photoresist layer utilizing conventional resist developer. The portions of the hard mask dielectric layer 16 that are protected by the photoresist block mask remain to provide a hard mask, and the portions of the dielectric layer that are not protected by the photoresist block mask are removed by an etch process. The etch process for removing the exposed portions of the hard mask dielectric layer 16 in patterning the mandrels may be an anisotropic etch, such as reactive ion etch or laser etch, or an isotropic etch, such as a wet chemical etch.

Figure 4:
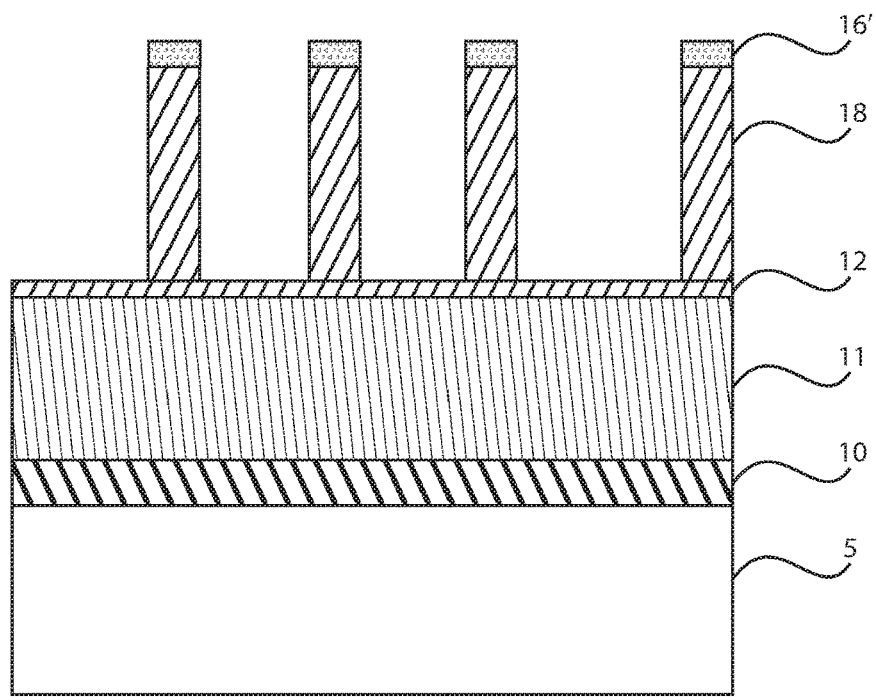
FIG. 4 is a side cross-sectional view depicting patterning mandrels from the amorphous silicon layer using the photoresist mask as an etch mask, in accordance with one embodiment of the present disclosure.

FIG. 4 depicts patterning mandrels from the mandrel layer, e.g., amorphous silicon layer, of the SADP process using the photoresist mask 17 as an etch mask. Following formation of the hard mask 16' by etching using the photoresist mask 17 as an etch mask, the photoresist mask 17 may be removed, e.g., by selective etching, chemical stripping, and/or oxygen etching, the mandrels 18 may be etched into the mandrel layer 15 using the hard mask 16' as an etch mask. The etch process for forming the mandrels 18 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the first openings 3 into the semiconductor substrate is reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present description include ion beam etching, plasma etching or laser ablation.

The etch process for patterning the mandrels 18 may terminate on an underlying hardmask layer, e.g., the second hardmask layer 12. The etch process for patterning the mandrels 18 may be selective to an underlying hardmask layer, e.g., the second hardmask layer 12. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

Figure 5:
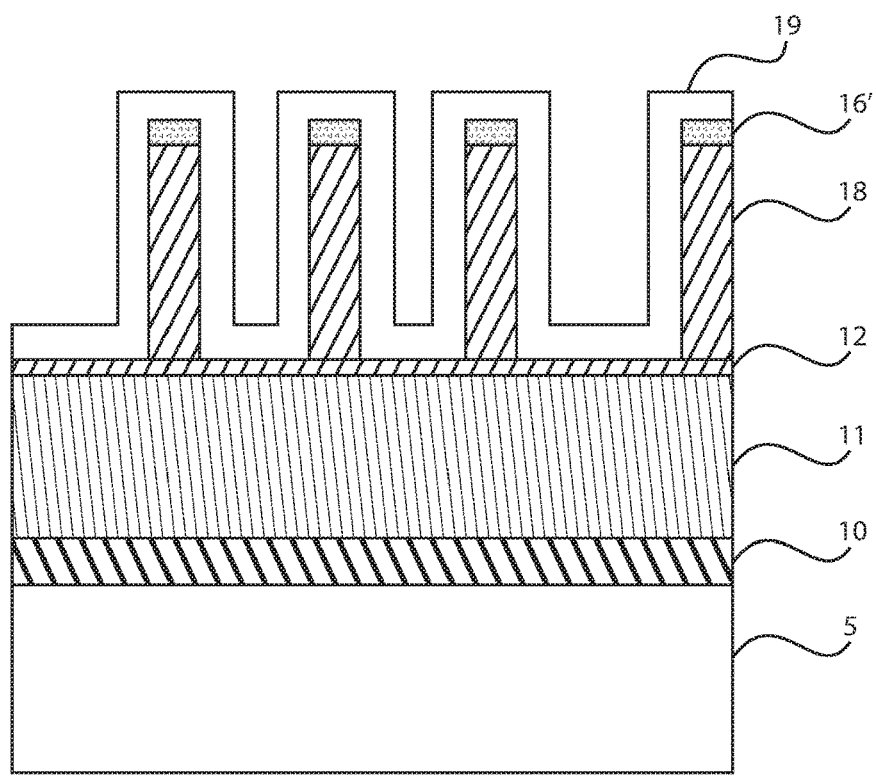
FIG. 5 is a side cross-sectional view depicting forming a material layer for dielectric spacers on the sidewalls of the mandrels.

FIG. 5 is a side cross-sectional view depicting forming a material layer 19 for first dielectric spacers 19' on the sidewalls of the mandrels 18. The first dielectric spacers 19' can be formed by deposition of a dielectric material 19, and then etching the deposited dielectric material 19. The dielectric material 19 may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD).

Figure 6A:
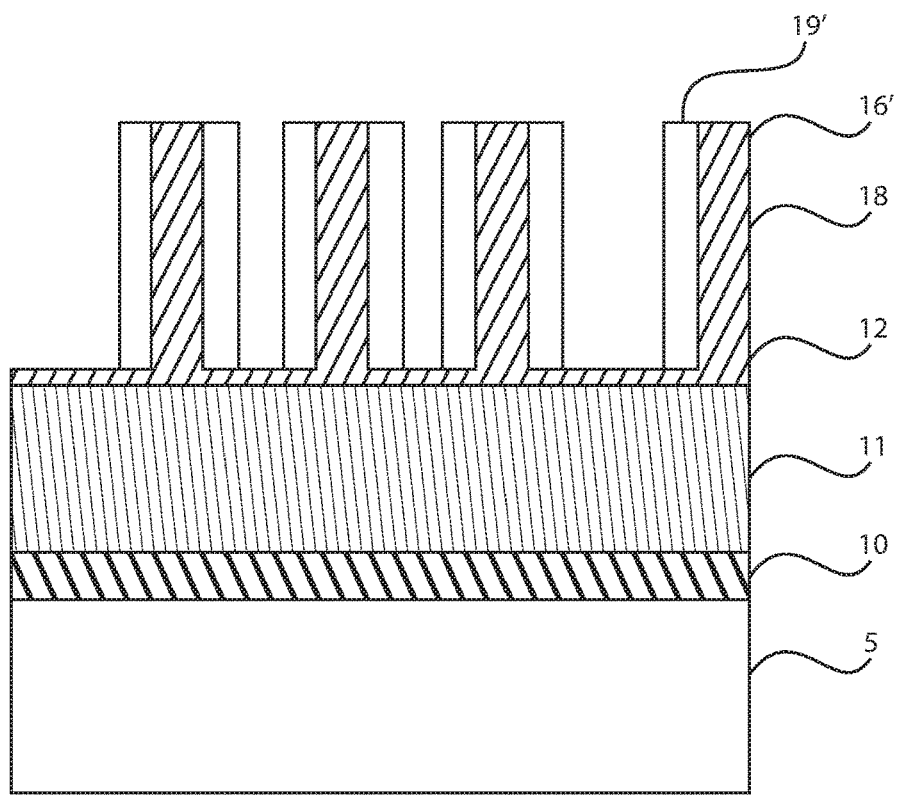
FIG. 6A is a side cross-sectional view depicting an etch back process to form the dielectric spacers from the material layer that is deposited in FIG. 5, in accordance with one embodiment of the present disclosure.
Figure 6B:
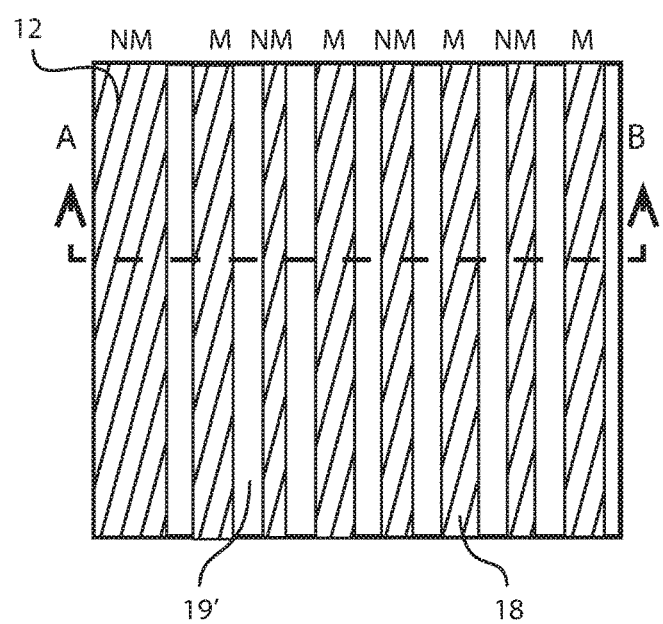
FIG. 6B is a top down view of the structure depicted in FIG. 6A.

FIGS. 6A and 6B depict an etch back process to form the first dielectric spacers 19' from the dielectric material layer 19 that is deposited in FIG. 5. FIG. 6B is a top down planar view, in which FIG. 6A is a side cross-sectional view depicting a cross-section along section line A-A. Examples of etching that be used in providing the first dielectric spacers 19' include any etching process such as, e.g., reactive ion etching (RIE). Because of the directional nature of the anisotropic etch, the horizontally orientated portions of the dielectric material layer 19 are removed, while the vertically oriented portions of the dielectric material layer 19 remain to provide the first dielectric spacers 19'.

Figure 7A:
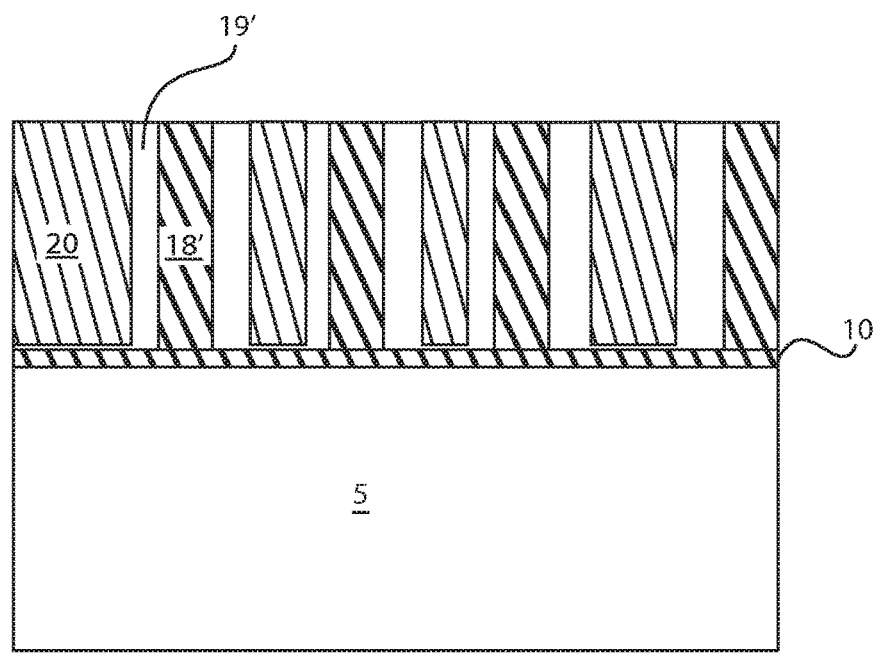
FIG. 7A is a side cross-sectional view depicting forming a non-mandrel material on the structure depicted in FIG. 6A, and planarizing the non-mandrel material to have an upper surface that is coplanar with the upper surface of the mandrels and the spacers, in accordance with one embodiment of the present disclosure.
Figure 7B:
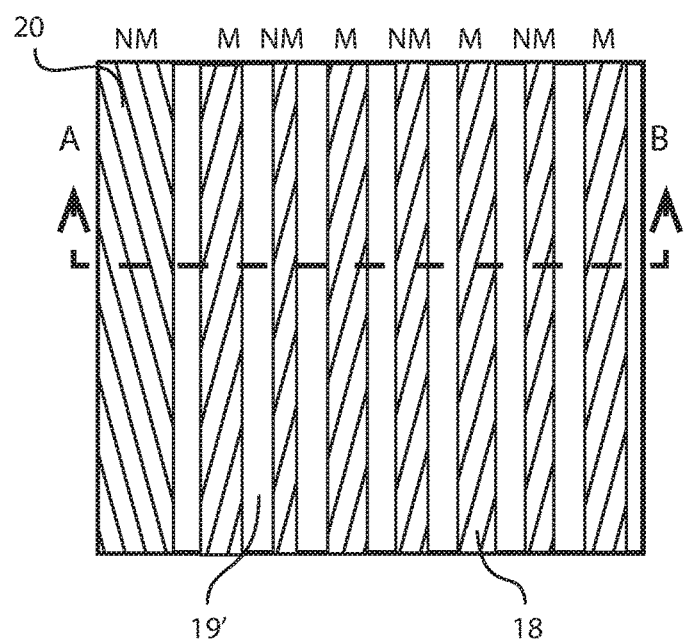
FIG. 7B is a top down view of the structure depicted in FIG. 7A.

FIGS. 7A and 7B depict forming a non-mandrel material 20 on the structure depicted in FIG. 6A, and planarizing the non-mandrel material 20 to have an upper surface that is coplanar with the upper surface of the mandrels 18 and the first dielectric spacers 19', in accordance with one embodiment of the present disclosure. It is noted that for the purposes of simplicity the optional organic planarization layer (OPL) and the second hardmask layer 12 have been removed. Following FIG. 7A, the process flow continues as if the mandrel layer 15 that provides the mandrels 18 was formed directly on the first hardmask layer 10.

The non-mandrel material 20 may be a dielectric material, such as an organic planarization layer (OPL). The organic planarization layer (OPL) that provides the non-mandrel material 20 may be an organic polymer, such as polyacrylate resin, epoxy resin, phenol resin, polyamide resin, polyimide resin, unsaturated polyester resin, polyphenylenether resin, polyphenylenesulfide resin, or benzocyclobutene (BCB). In other embodiments, the non-mandrel material may be an inorganic material, such as an oxide, e.g., silicon oxide, nitride, e.g., silicon nitride, or a silicon oxynitride material. The non-mandrel material may be deposited using chemical vapor deposition, spin on deposition or deposition from chemical solution. Following deposition, the non-mandrel material 20 is planarized so the upper surface of the non-mandrel material is coplanar with the upper surface of the dielectric spacer 19' and the upper surface of the mandrels 18.

Figure 8A:
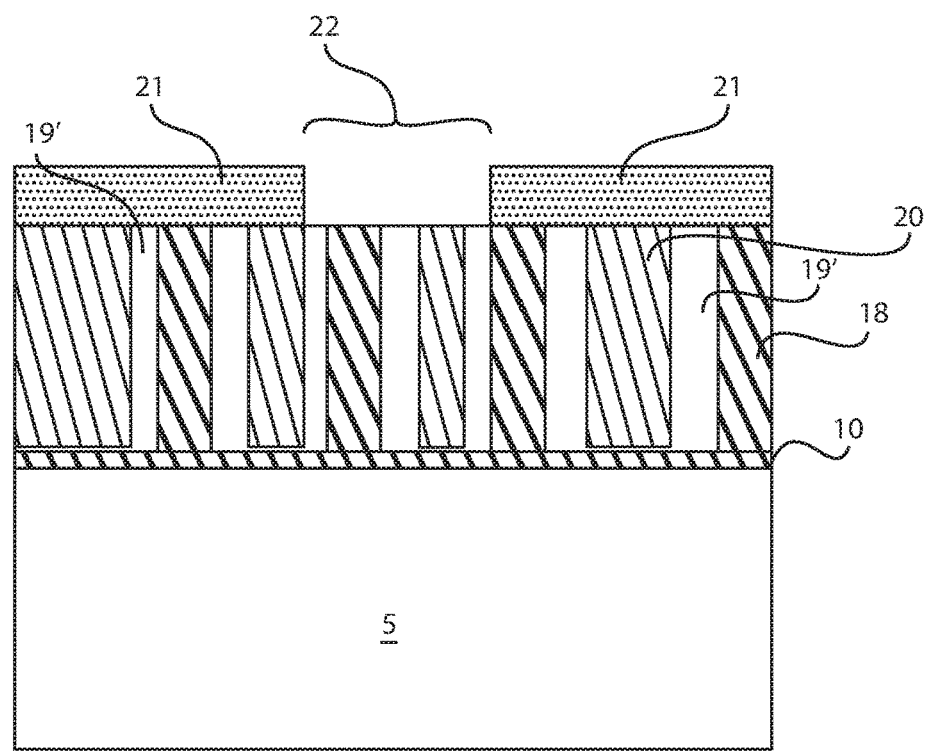
FIG. 8A is a side cross-sectional view depicting forming a photoresist mask on the structure depicted in FIG. 7A to join the mandrel and non-mandrel structures, in accordance with one embodiment of the present disclosure.
Figure 8B:
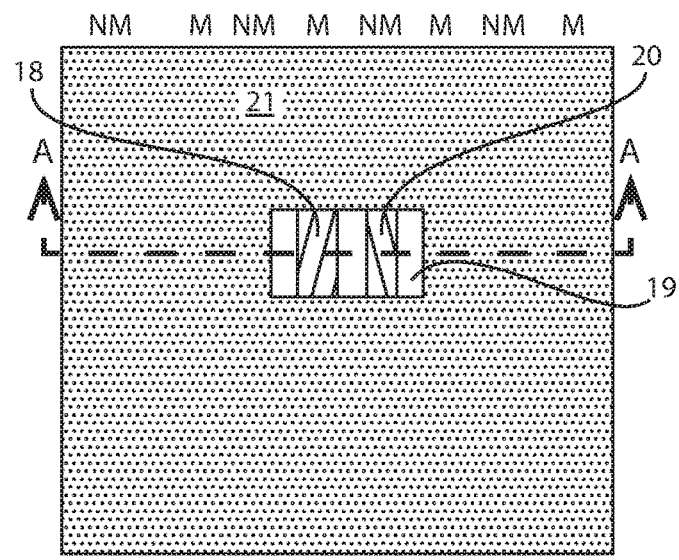
FIG. 8B is a top down view of the structure depicted in FIG. 8A.

FIGS. 8A and 8B depicting forming a photoresist mask 21 on the structure depicted in FIGS. 7A and 7B to join the mandrel 18 and non-mandrel structures 20 (the non-mandrel material 20 may also be referred to as the non-mandrel structure 20). The photoresist structure 21 is formed having a window 22 exposing a portion of the structure that includes the first dielectric spacer 19' (centrally positioned first dielectric spacer 19") of which a portion is to be removed to form the joining structure between the mandrel 18 and non-mandrel 20 formed electrically conductive lines. The photoresist mask 21 may be formed using deposition, photolithography and development processes. For example, a photoresist mask 21 can be produced by applying a photoresist layer to the upper surface of the non-mandrel structure 20, the mandrel structure 18 and the first dielectric spacers 19', exposing the photoresist layer to a pattern of radiation, and then developing the pattern into the photoresist layer utilizing conventional resist developer.

Figure 9:
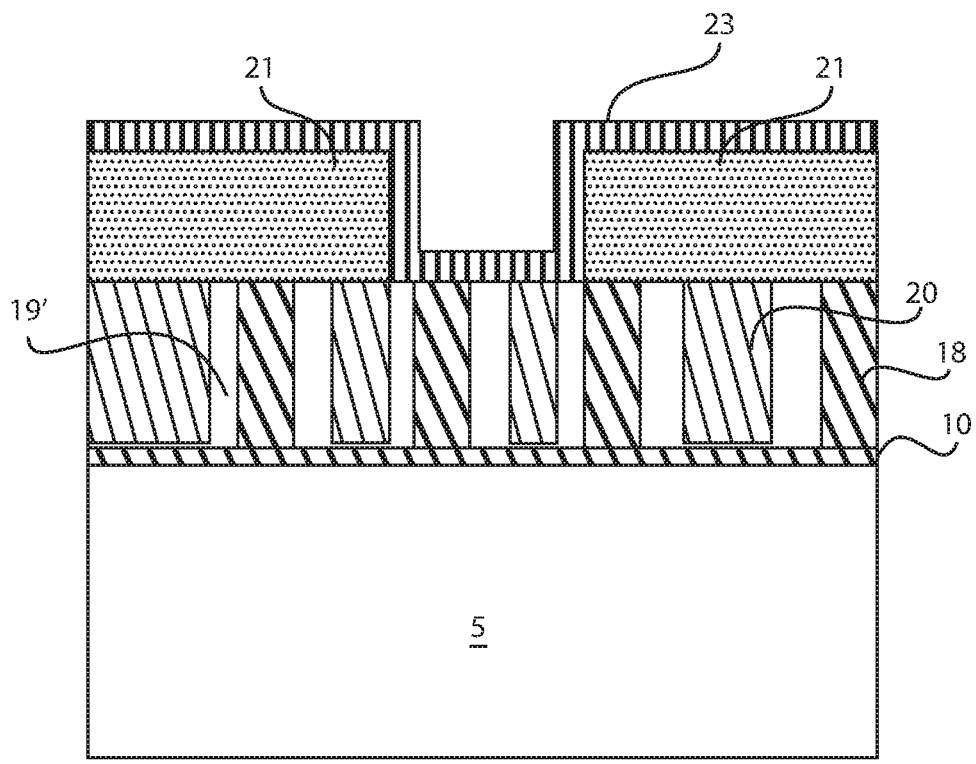
FIG. 9 is a side cross-sectional view depicting one embodiment of depositing a material layer for a second spacer on the photoresist mask depicted in FIG. 8A.

FIG. 9 depicts one embodiment of depositing a material layer 23 for a second dielectric spacer on the photoresist mask 21 depicted in FIGS. 8A and 8B. The material layer 23 may be a conformally deposited dielectric material, such as an oxide, nitride or oxynitride. In some embodiments, when the material layer 23 is an oxide, the material layer 23 may be silicon oxide. In some embodiments, when the material layer 23 is a nitride, the material layer may be silicon nitride. In some embodiments, when the material layer 23 is an oxynitride, the material layer 23 may be silicon oxynitride.

The material layer 23 may be blanket deposited on the structure depicted in FIGS. 8A and 8B including the sidewalls of the photoresist mask 21 and the upper surfaces of the first dielectric spacers 19', the mandrel material 18 and the non-mandrel material 20 that is exposed by the window 22 in the photoresist mask 21. The material layer 23 may have a conformal thickness, and is formed using a conformal deposition process. The term "conformal" denotes a layer having a thickness that does not deviate from greater than or less than 30% of an average value for the thickness of the layer. The thickness of the material layer 23 is selected so that the portion of the material layer 23 that is formed on the sidewalls of the photoresist mask is sufficiently wide to cover the portions of the end first dielectric spacers 19' that are exposed by the window 23, but not so wide so that the central first dielectric spacer 19" is still exposed. The material layer 23 is typically deposited using chemical vapor deposition (CVD). An example of chemical vapor deposition (CVD) that is suitable for forming the material layer 23 is plasma enhanced chemical vapor deposition (PECVD).

Figure 10A:
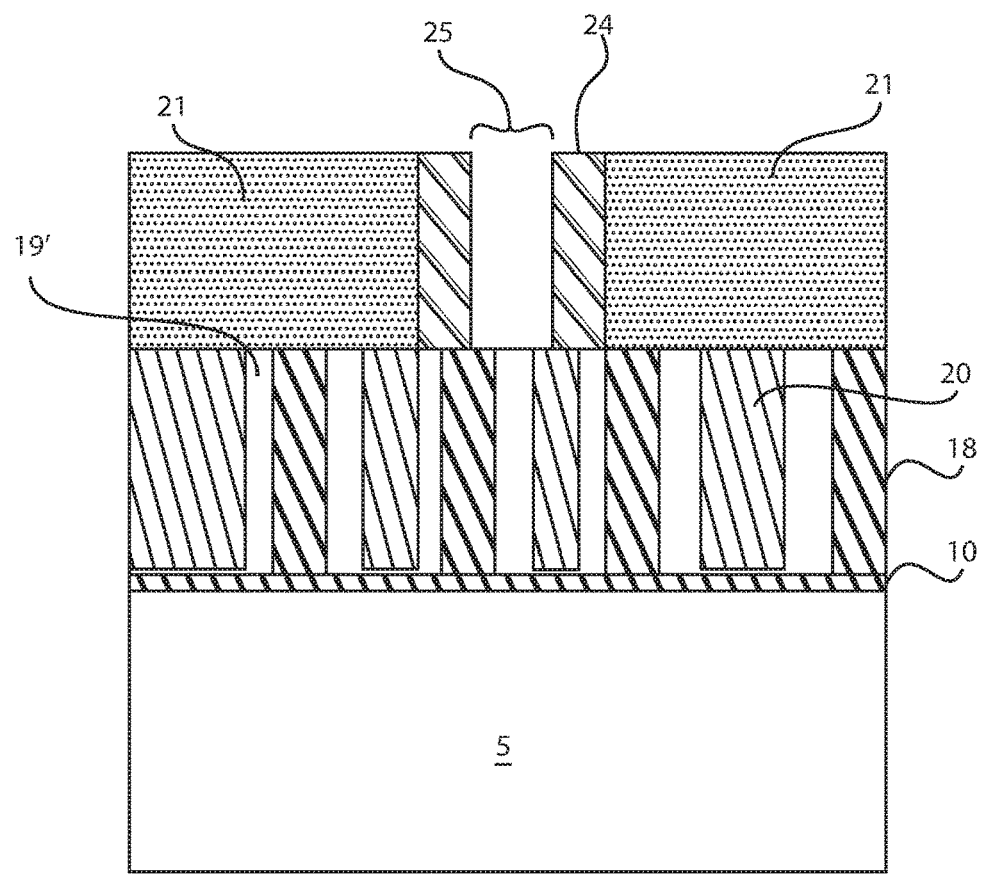
FIG. 10A is a side cross-sectional view depicting one embodiment of a second spacer etch back process to expose a portion of the underlying spacer that is to be removed, in which the second spacer deposition and etch back on the FIG. 10B is a top down view of the structure depicted in FIG. 10A.
Figure 10B:
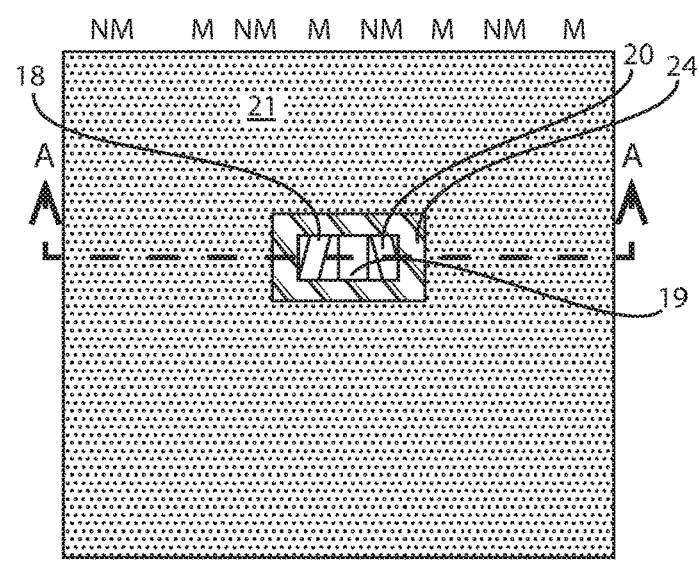

FIGS. 10A and 10B depicting one embodiment of a second spacer etch back process applied to the material layer 23 to provide the second dielectric spacers 24 that expose a portion of the underlying spacers that is to be removed, i.e., centralized first dielectric spacer 19", in which the second dielectric spacer 24 has a width that protects the first dielectric spacers 19' that are not be removed during the mandrel 18 to non-mandrel 20 connection flow. The spacer etch back process may be an anisotropic etch. As used herein, an "anisotropic etch process" denotes a material removal process in which the etch rate in the direction normal to the surface to be etched is greater than in the direction parallel to the surface to be etched. The anisotropic etch process may be provided by reactive ion etch (RIE). In some embodiments, because of the height of the material layer 23 on the sidewalls of the photoresist mask 21 (referred to as vertically orientated portions of the material layer 23) is greater than the height of the material layer 23 on the upper surface of the photoresist mask 21 and the upper surface of the first dielectric spacers 19', 19", mandrel 18 and non-mandrel structures 20 in the window 22 (referred to as horizontally orientated portions of the material layer 23), the anisotropic etch can remove the horizontally orientated portions of the material layer 23, while the vertically orientated portions remain to provide the second dielectric spacers 24. The anisotropic nature of the etch process may also be provided by laser etching and gas plasma etching. In some embodiments, the etch process for etching the material layer 23 may be selective to the upper surface of the first dielectric spacers 19', 19", mandrel 18 and non-mandrel structures 20 in the window 22. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for forming the second dielectric spacer 24 produces an etch window 25 that exposes the centralized first dielectric spacer 19".

Figure 11A:
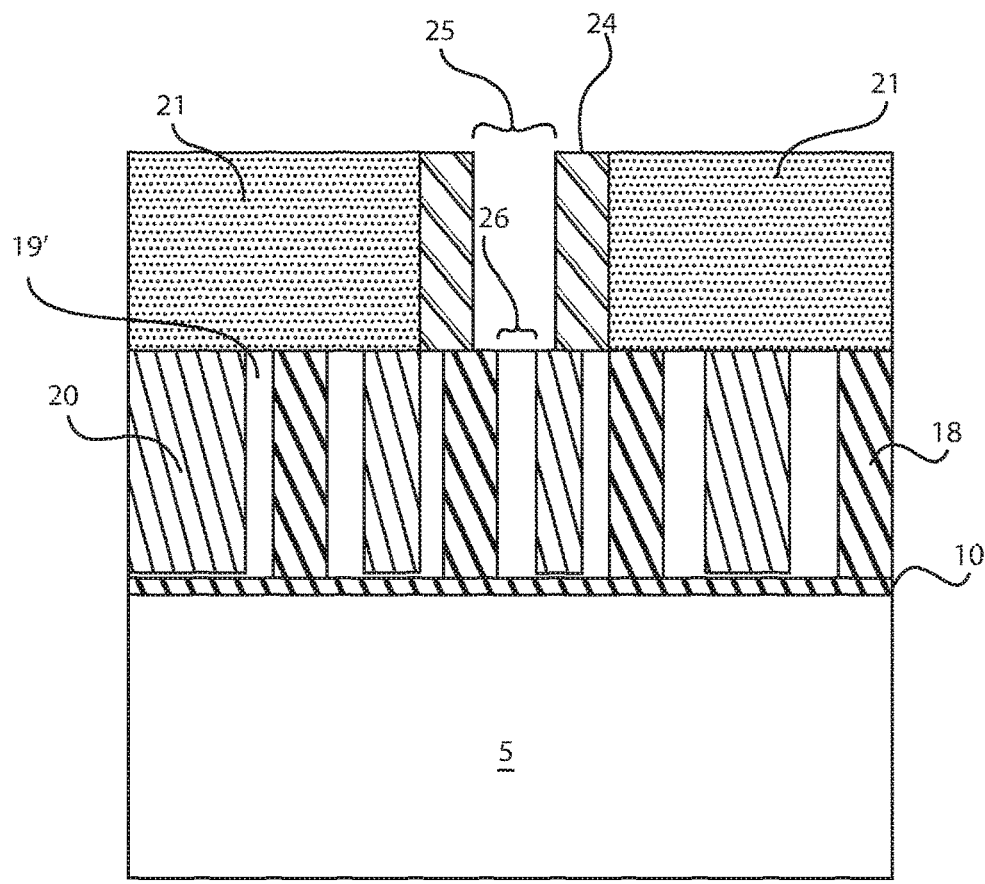
FIG. 11A is a side cross-sectional view depicting one embodiment of a spacer etch between the mandrel and non-mandrel materials.
Figure 11B:
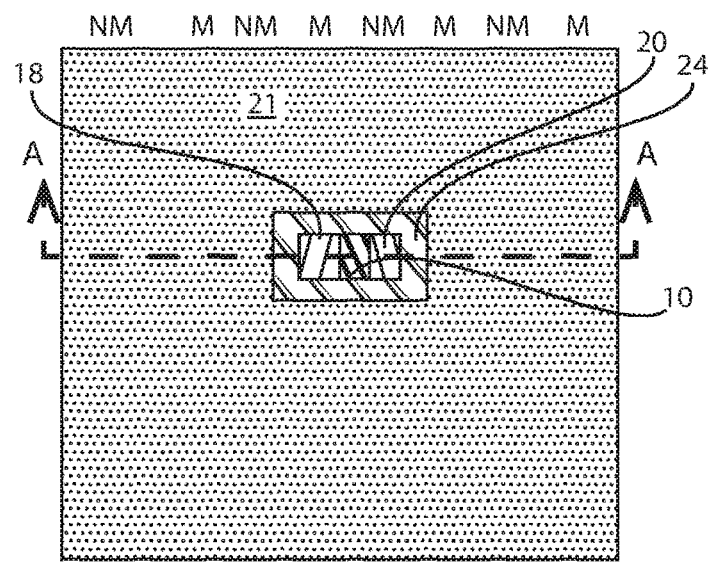
FIG. 11B is a top down view of the structure depicted in FIG. 11A.

FIGS. 11A and 11B depict one embodiment of a spacer etch to remove the portion of the centralized first dielectric spacer 19" that is within the etch window 25 and is present between the mandrel structure 18 and non-mandrel structure 20. The etch process for the spacer etch for removing the exposed portion of the centralized first dielectric spacer 19" may be a selective etch process. The etch process is typically selective to the mandrel structure 18 and the non-mandrel structure 20. The etch process for removing the exposed portion of the centralized spacer 19" may also be selective to the photoresist etch mask 21 and the second dielectric spacer 24. The portion of the centralized first dielectric spacer 19" that is not present in the etch window 25 is protected from being etched by the photoresist etch mask 21 and the second dielectric spacer 24. In some embodiments, removing the exposed portion of the centralized first dielectric spacer 19" includes an etch that is also selective to the first hardmask layer 10. The etch for removing the exposed portion of the centralized first dielectric spacer 19" may be a dry etch, such as reactive ion etch (RIE), laser etch, or plasma gas etch, or the etch for removing the exposed portion of the centralized first dielectric spacer 19" may be a wet etch, such as a wet chemical etch. Removing the exposed portion of the centralized first dielectric spacer 19" provides an opening 26 for connecting mandrel and non-mandrel formed structures.

In some embodiments, it is not necessary that the first dielectric spacers 19', 19", and the second dielectric spacers 24 have compositions that provide for the first dielectric spacer 19" to be removed selectively to the second dielectric spacer 24. In some embodiments, the height of the second dielectric spacer 24 is selected to be greater than the height of the centralized first dielectric spacer 19" to provide for greater protection of the first dielectric spacer 19' during the etch process steps for removing the centralized first dielectric spacer 19". By providing a greater height with the second dielectric spacer 24, more material must be removed by the anisotropic etch, e.g., reactive ion etch (RIE), before the etch process can contact with underlying first dielectric spacers 19'. This provides that the a greater amount of material is present overlying the first dielectric spacers 19' during the etch process that removes the centralized first dielectric spacer 19" to form the opening 26 for connecting mandrel and non-mandrel formed structures.

Figure 12A:
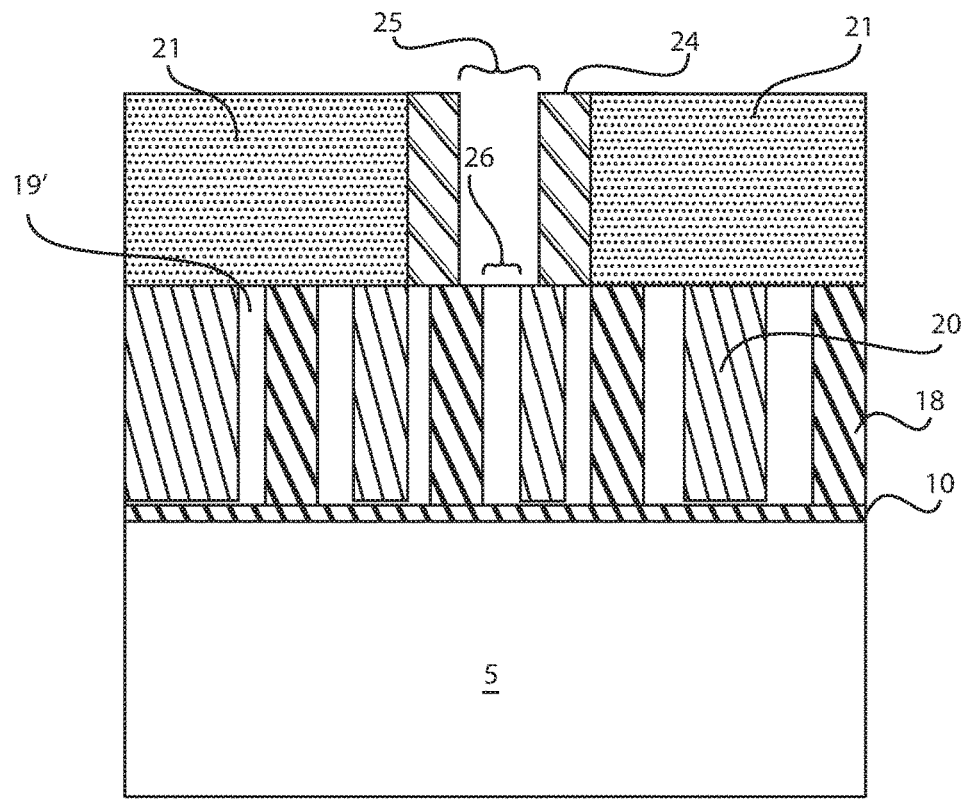
FIG. 12A is a side cross-sectional view depicting one embodiment of a mandrel material or non-mandrel material cut flow to cut the trenches.
Figure 12B:
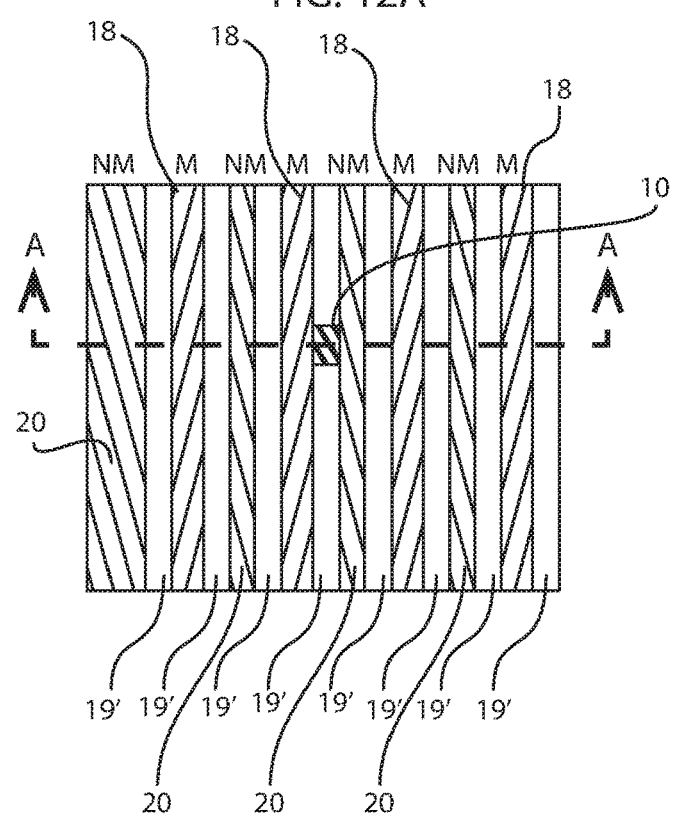
FIG. 12B is a top down view of the structure depicted in FIG. 12A.

FIGS. 12A and 12B depict one embodiment of a mandrel material or non-mandrel material cut flow to cut the trenches. This typically begins with removing the photoresist mask 21 and the second dielectric spacer 24. The photoresist mask 21 may be removed using selective etching, chemical stripping and/or oxygen ashing. The second dielectric spacer 24 may also be removed using selective etching. The selective etch processes used at this stage of the process flow may include a dry etch process, such as reactive ion etching (RIE) or plasma etching, or a wet etch process, such as a wet chemical etch.

FIG. 12B illustrate the top down view of the portion of the centralized first dielectric spacer 19" that is removed to provide a trench between the mandrel material 18 and the non-mandrel material 20. The trench is illustrated by the exposed portion of the first hardmask layer 10 that is exposed in FIG. 12B.

Figure 13A:
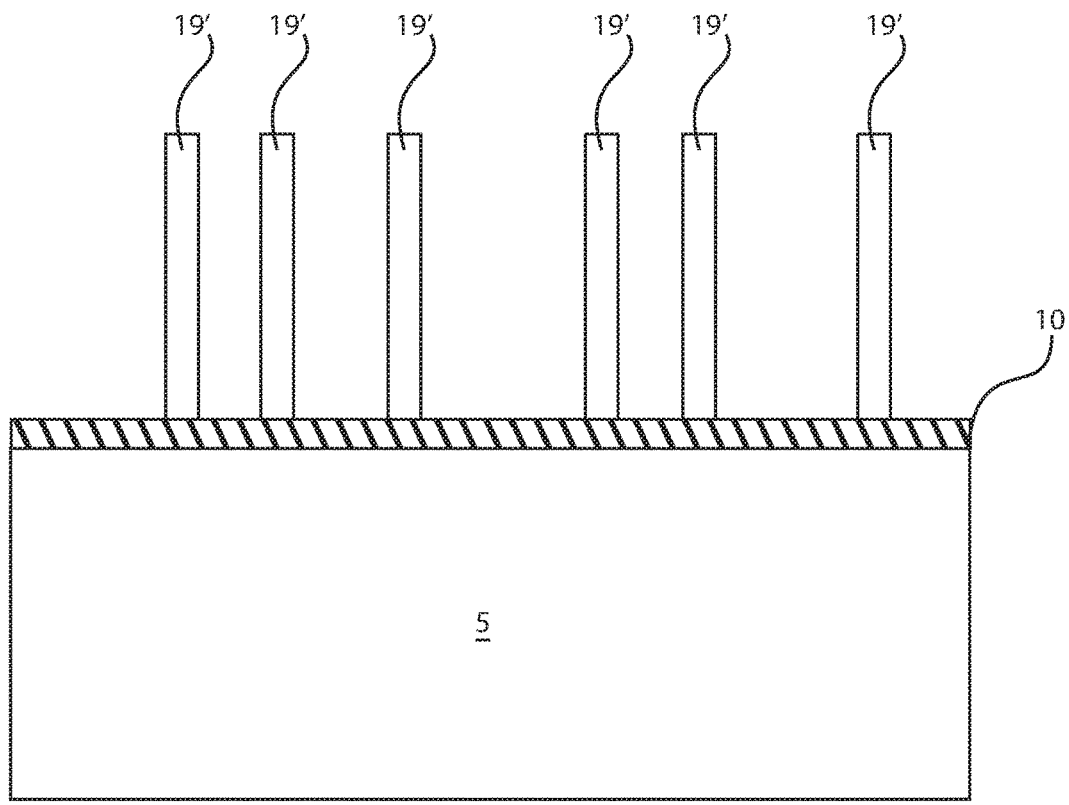
FIG. 13A is a side cross-sectional view depicting removing the fill material.
Figure 13B:
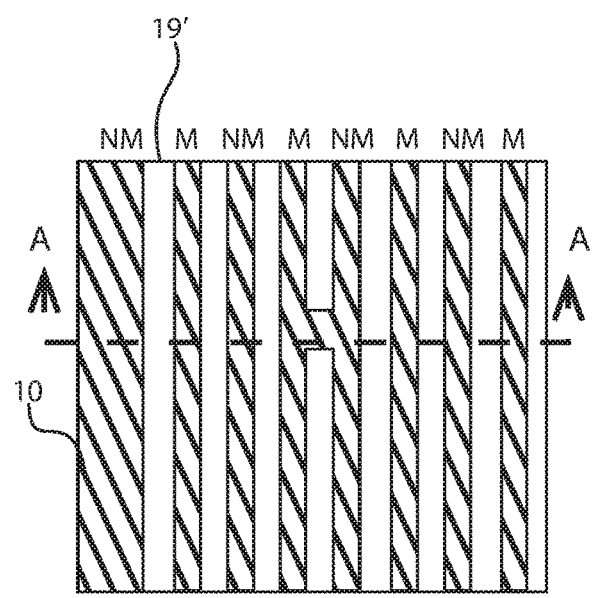
FIG. 13B is a top down view of the structure depicted in FIG. 13A.

FIGS. 13A and 13B depict removing the fill material. In one embodiment, removing the fill material includes removing the mandrel structures 18 and the non-mandrel structures 20. The mandrel structures 18 and non-mandrel structures 20 may be removed selectively to the first dielectric spacers 19', as well as the remaining portion of the centralized first dielectric spacer 19". The etch process for removing the mandrel structures 18 and the non-mandrel structures 20 may be a dry etch, such as reactive ion etching (RIE) and/or gas plasma etching, and/or the etch process for removing the mandrel structures 18 and non-mandrel structures 20 may be a wet chemical etch. FIG. 13B clearly depicts the cut in the centralized first dielectric spacer 19" that connects the openings provided by removing the mandrel structures 18 from the non-mandrel structures 20.

Figure 14A:
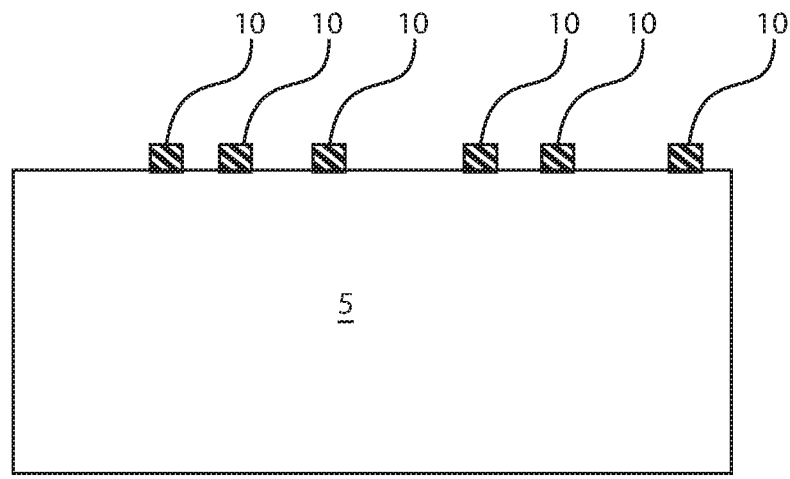
FIG. 14A is a side cross-sectional view depicting the hardmask layer being patterned using the structure depicted in FIGS. 13A and 13B as an etch mask, in which the mandrel and non-mandrel trenches are connected.
Figure 14B:
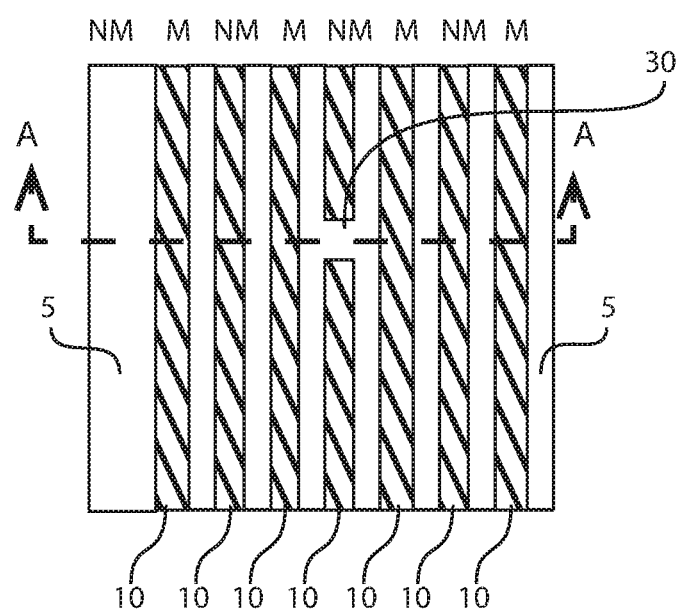
FIG. 14B is a top down view of the structure depicted in FIG. 14A.

FIGS. 14A and 14B depict etching the first hardmask layer 10 using the first dielectric spacer 19' and the centralized first dielectric spacer 19" including the opening 30 for connecting the trenches corresponding to the mandrel structures 18 (M) to the trenches corresponding to the non-mandrel structures 20 (NM). The etch process for etching the first hardmask layer 10 is selective to at least the first dielectric spacer 19' and the centralized first dielectric spacer 19". The etch process for etching the first metal containing layer 10 using the dielectric spacers as an etch mask may be an anisotropic etch. As used herein, an "anisotropic etch process" denotes a material removal process in which the etch rate in the direction normal to the surface to be etched is greater than in the direction parallel to the surface to be etched. The etch process for etching the first metal containing layer 10 may be provided by reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

FIG. 14B illustrates that the trenches formed by the mandrel structures (identified by M) separating adjacent metal lines produced by etching the first metal containing layer 10, and the trenches formed by the non-mandrel structures (identified by NM) separating adjacent metal lines produced by etching the first metal containing layer 10 may have a connecting portion 30, i.e., connecting trench 30, that is produced by etching the centralized first spacer 19" to provide the opening 26 for connecting mandrel and non-mandrel formed structures (as depicted in FIGS. 11A-12B). The metal lines that have been patterned match the design depicted in FIG. 1. The metal lines (etched first hardmask layer), trenches separating the metal lines, and the connecting trench 30 are on the same level of a micro-electronic and/or nano-electronic device, e.g., an integrated circuit device.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An etch method comprising:
   forming first spacers on sidewalls of a plurality of mandrel structures that are present on a substrate;
   forming a fill of non-mandrel structures between sidewalls of said first spacers that are not in contact with the plurality of mandrel structures;
   forming second spacers on sidewalls of an etch mask having a window that exposes a connecting portion of one of the first spacers in the etch window;
   removing the connecting portion of said one of the first spacers; and
   etching the substrate using a remaining portion of the first spacers as an etch mask, wherein an opening is formed from the space provided by said removing the connecting portion of the first dielectric connects a first trench patterned by the mandrel structure and a second trench patterned by a non-mandrel structure on a same lithographic level.

2. The etch method of claim 1, wherein the substrate is a silicon containing dielectric layer.

3. The etch method of claim 2, wherein the opening in the substrate is filled to provide a metal line.

4. The etch method of claim 1, wherein forming the first spacers on sidewalls of the mandrel structures comprises:
   conformally depositing a material layer for the spacers on the plurality of mandrel structures; and
   etching the material layer, wherein the horizontally orientated portions are removed, and the vertically orientated portions of the material layer remains to provide the first spacers.

5. The etch method of claim 1, wherein forming said etch mask comprises:
   depositing a photoresist layer; and
   patterning the photoresist layer to provide said etch window.

6. The etch method of claim 5, wherein the etch window exposes the connecting portion of the first spacer.

7. The etch method of claim 1, wherein said removing the connecting portion of the centralized first dielectric spacer comprises an etch that is selective to the second dielectric spacers.

8. The etch method of claim 1, further comprising removing the mandrel structures and non-mandrel structures selectively to the first dielectric spacers.

9. The etch method of claim 1, wherein the mandrel structures, the non-mandrel structure and the first dielectric spacers have geometries that are arranged to provide a self-aligned double patterning (SADP) etch process.

10. A self-aligned double patterning (SADP) etch method comprising:
    forming a plurality of etched features separated by trenches produced by mandrel and non-mandrel structures of the SADP etch method; and
    forming an opening in at least one of said plurality of etched features connecting a first trench of said trenches separating etched features corresponding to one of said mandrel structures and a second trench corresponding to one of said non-mandrel structures on a same lithographic level.

11. The etch method of claim 10, wherein the etched feature is a metal line for conducting electrical current to an electrical device.

* * * * *